United States Patent
Yao et al.

(10) Patent No.: US 10,001,815 B1
(45) Date of Patent: Jun. 19, 2018

(54) HINGE DEVICE

(71) Applicant: FIRST DOME CORPORATION, New Taipei (TW)

(72) Inventors: Hsu-Hong Yao, New Taipei (TW); Yi-Cheng Liao, New Taipei (TW)

(73) Assignee: First Dome Corporation, New Taipei (TW)

( * ) Notice: Subject to any disclaimer, the term of this patent is extended or adjusted under 35 U.S.C. 154(b) by 0 days. days.

(21) Appl. No.: 15/819,602

(22) Filed: Nov. 21, 2017

(30) Foreign Application Priority Data

Aug. 7, 2017 (TW) .............................. 106211591 U

(51) Int. Cl.
| | |
|---|---|
| *E05D 1/04* | (2006.01) |
| *E05D 11/06* | (2006.01) |
| *G06F 1/16* | (2006.01) |
| *E05D 11/08* | (2006.01) |
| *F16C 11/10* | (2006.01) |
| *H05K 5/02* | (2006.01) |
| *F16M 13/00* | (2006.01) |

(52) U.S. Cl.
CPC .......... *G06F 1/1681* (2013.01); *E05D 11/084* (2013.01); *F16C 11/103* (2013.01); *H05K 5/0234* (2013.01); *E05D 2011/085* (2013.01); *E05Y 2900/606* (2013.01); *F16M 13/005* (2013.01); *G06F 1/1626* (2013.01)

(58) Field of Classification Search
CPC ... Y10T 16/542; Y10T 16/543; Y10T 16/544; Y10T 16/5443; Y10T 16/5445; Y10T 16/5448; Y10T 16/545; Y10T 16/54038; G06F 1/16; G06F 1/1616; G06F 1/1681; G06F 1/166; G06F 1/1679; H04M 1/022; H04M 1/0214; H04M 1/0216; H04M 1/0222; H05K 5/0226; F16M 11/10; E05D 11/1021; E05D 11/1078; E05D 11/082; E05D 3/18; E05D 3/122; E05D 3/12; E05D 3/16; E05D 3/06; E05D 3/32; E05D 15/28; E05D 15/30; E05D 15/32; E05D 15/40; E05D 1/04; E05D 2001/045; E05Y 2900/606

See application file for complete search history.

(56) References Cited

U.S. PATENT DOCUMENTS

| | | | | | |
|---|---|---|---|---|---|
| 4,146,320 | A | * | 3/1979 | Schrader ................ | G03B 17/04 396/145 |
| 5,061,023 | A | * | 10/1991 | Soubliere .................. | E05D 1/04 16/355 |
| 5,946,774 | A | * | 9/1999 | Ramsey .................... | E05D 1/04 16/355 |

(Continued)

*Primary Examiner* — Chuck Mah
(74) *Attorney, Agent, or Firm* — LeClairRyan

(57) ABSTRACT

A hinge device for connecting first and second objects includes a base seat and a sliding member slidably connected to the base seat through a coupling member to be turned about a rotating axis between folded and unfolded states. In the folded state, first and second object connecting sections of the base seat and the sliding member are disposed at two opposite sides of a mounting section of the base seat to allow folding of the objects to each other. In the unfolded state, the second object connecting section is placed above the first object connecting section to allow the second object to be unfolded and inclined to the first object.

11 Claims, 19 Drawing Sheets

(56) References Cited

U.S. PATENT DOCUMENTS

| | | | | |
|---|---|---|---|---|
| 6,317,929 | B1* | 11/2001 | Ring | E05D 1/04 |
| | | | | 16/355 |
| 9,366,064 | B1* | 6/2016 | Chen | E05D 3/12 |
| 9,404,298 | B1* | 8/2016 | Chen | G06F 1/1681 |
| 9,834,965 | B1* | 12/2017 | Yao | E05D 3/02 |
| 9,856,909 | B1* | 1/2018 | Hsu | F16C 11/04 |
| 2014/0293534 | A1* | 10/2014 | Siddiqui | E05D 7/00 |
| | | | | 361/679.55 |
| 2015/0192965 | A1* | 7/2015 | Chang | G06F 1/1681 |
| | | | | 361/679.56 |
| 2016/0083989 | A1* | 3/2016 | Kuo | E05D 1/04 |
| | | | | 16/355 |
| 2016/0097227 | A1* | 4/2016 | Hsu | G06F 1/16 |
| | | | | 16/354 |
| 2017/0003719 | A1* | 1/2017 | Siddiqui | E05D 1/04 |
| 2017/0139446 | A1* | 5/2017 | Lan | G06F 1/1681 |
| 2017/0208703 | A1* | 7/2017 | Lin | E05F 1/1016 |
| 2017/0257961 | A1* | 9/2017 | Chen | H05K 5/0226 |
| 2017/0269637 | A1* | 9/2017 | Lin | G06F 1/1615 |

* cited by examiner

HINGE DEVICE

CROSS-REFERENCE TO RELATED APPLICATION

This application claims priority of Taiwanese Patent Application No. 106211591, filed on Aug. 7, 2017.

FIELD

The disclosure relates to a hinge device, and more particularly to a hinge device for connecting an electronic device and a kickstand.

BACKGROUND

Recently, hinges for electronic devices are widely used. Along with the popularization and thinning of electronic devices, thinner hinges are in demand. For example, a hinge is disposed to connect a tablet computer and a kickstand to allow rotation and positioning of the kickstand at a predetermined angle relative to the tablet computer for facilitating usage of the tablet computer. It is desired to make a hinge thinner with a low-cost and simple process.

SUMMARY

Therefore, an object of the disclosure is to provide a hinge device that can alleviate at least one of the drawbacks of the prior art.

According to the disclosure, the hinge device for connecting a first object and a second object to allow relative folding and unfolding movements with respect to each other includes a base seat, a coupling member and a sliding member. The base seat includes a first object connecting section which is adapted to be connected to the first object, and a mounting section which extends from the first object connecting section in a first direction. The mounting section has two base lateral walls which are opposite to each other in a second direction that is transverse to the first direction, at least one first arcuate slot which is formed in one of the base lateral walls, and at least one first stop which is disposed adjacent to the first arcuate slot. The first arcuate slot extends along a curve of which a centre of curvature is located above a top of the base seat, and has an end which is adjacent to the object connecting section and which has a first access port at the top of the base seat. The coupling member is slidably connected to the mounting section, and has two coupling lateral walls which are spaced apart from each other in the second direction to respectively have coupling inner lateral surfaces that face each other and that are disposed outwardly of the base lateral walls, respectively, and coupling outer lateral surfaces that are opposite to each other, a crosspiece portion which interconnects the coupling lateral walls, at least one first arcuate protrusion which is formed on one of the coupling inner lateral surfaces and which is slidably engaged in the first arcuate slot, at least one second arcuate slot which is formed in one of the coupling outer lateral surfaces, and at least one second stop which is disposed adjacent to the second arcuate slot. The second arcuate slot extends along a curve of which a centre of curvature is located above a top of the coupling member, and has an end which is adjacent to the first access port and which has a second access port at the top of the coupling member. The centers of curvature of the first and second arcuate slots cooperatively define a rotating axis that extends parallel to the top of the base seat and in the second direction. The sliding member is slidably connected to the coupling member, and has two sliding lateral walls which are spaced apart from each other in the second direction to respectively have sliding inner lateral surfaces that face each other and that are disposed outwardly of the coupling outer lateral surfaces, respectively, and sliding outer lateral surfaces that are opposite to each other, a second object connecting section which is connected to and extends from the sliding lateral walls in the first direction and which is adapted to be connected to the second object, and at least one second arcuate protrusion which is formed on one of the sliding inner lateral surfaces and which is slidably engaged in the second arcuate slot. The sliding member is operatively turned about the rotating axis relative to the base seat with movement of the second arcuate protrusion along the second arcuate slot to bring the second arcuate protrusion into abutment against the second stop, and to further drive turning of the coupling member about the rotating axis relative to the base seat with movement of the first arcuate protrusion along the first arcuate slot until abutment of the first arcuate protrusion against the first stop, so as to shift the hinge device from a folded state, where the first object connecting section and the second object connecting section are disposed at two opposite sides of the mounting section in the first direction to allow folding of the first and second objects to each other, to an unfolded state, where the second object connecting section is placed above the first object connecting section to allow the second object to be unfolded and inclined to the first object by an angle.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
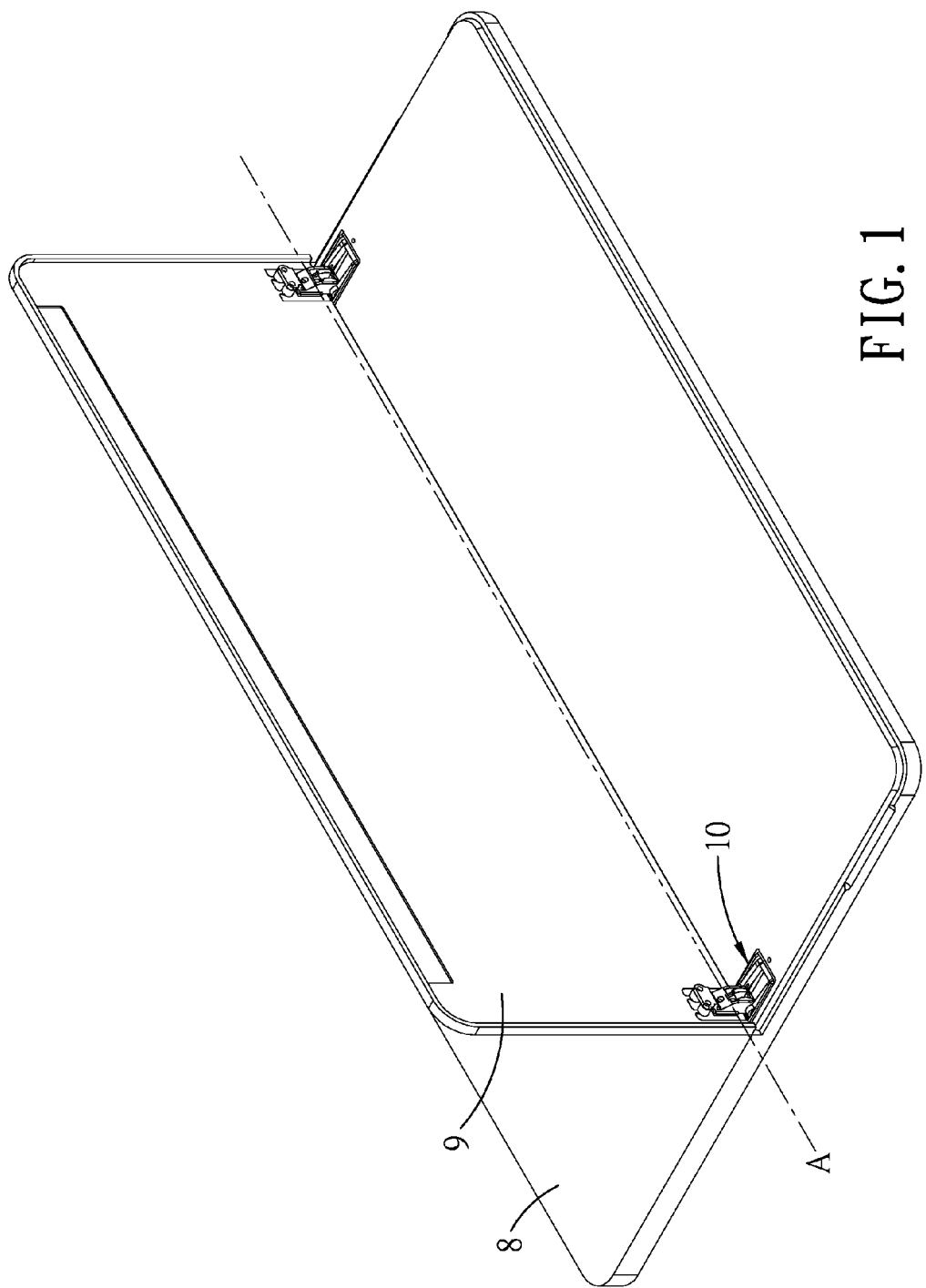
FIG. 1 is a perspective view illustrating an embodiment of a hinge device according to the disclosure incorporated in a tablet computer.
Figure 2:
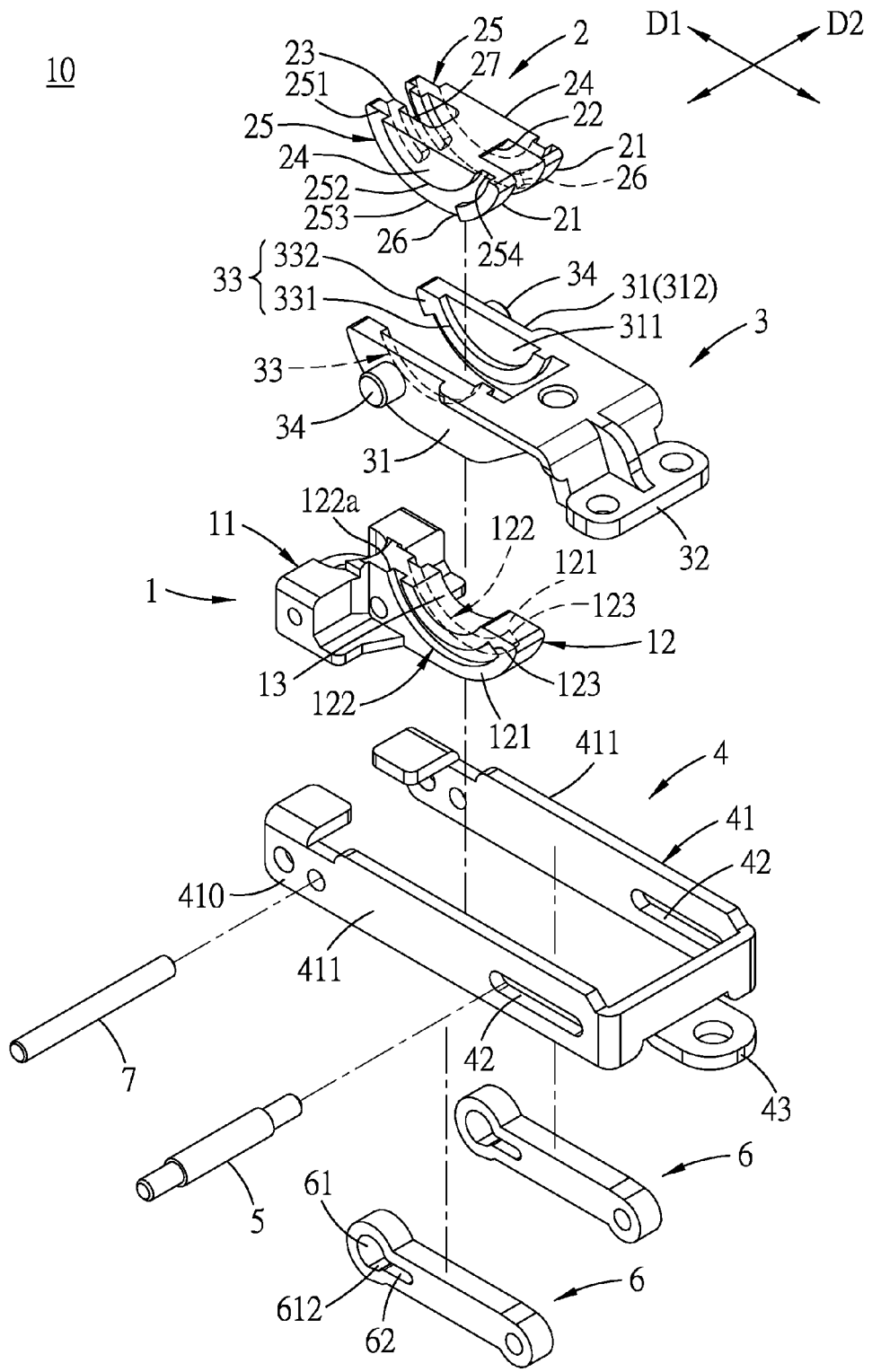
FIG. 2 is an exploded perspective view of the embodiment.

Referring to FIGS. 1 and 2, an embodiment of the hinge device 10 is adapted for connecting a first object 8 and a second object 9 to allow relative folding and unfolding movements with respect to each other. In this embodiment, the first object 8 is a tablet computer, and the second object 9 is a kickstand. The hinge device 10 includes a base seat 1, a coupling member 2, a sliding member 3, a frame member 4, a sliding shaft 5, two linking arms 6 and a fastening shaft 7.

Figure 3:
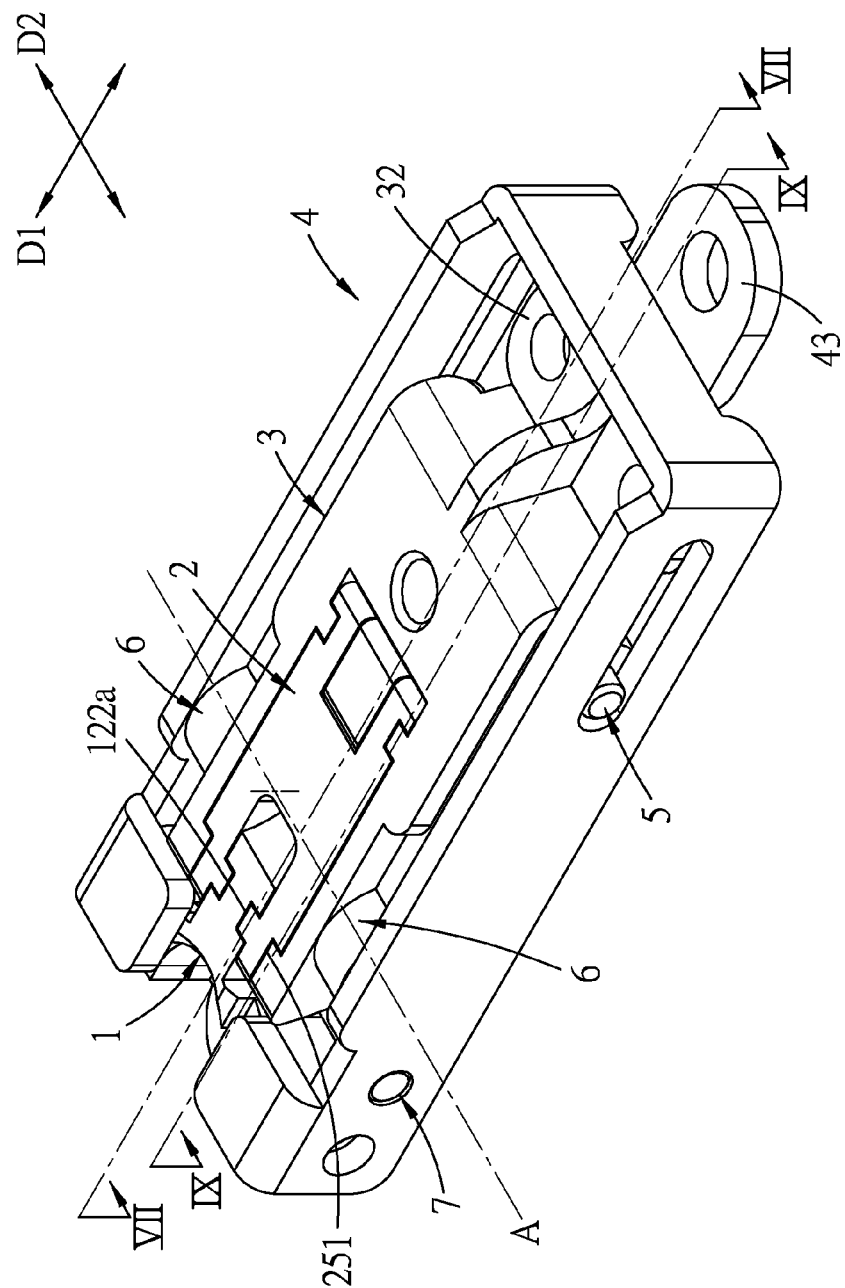
FIG. 3 is a perspective view of the embodiment in a folded state.
Figure 4:
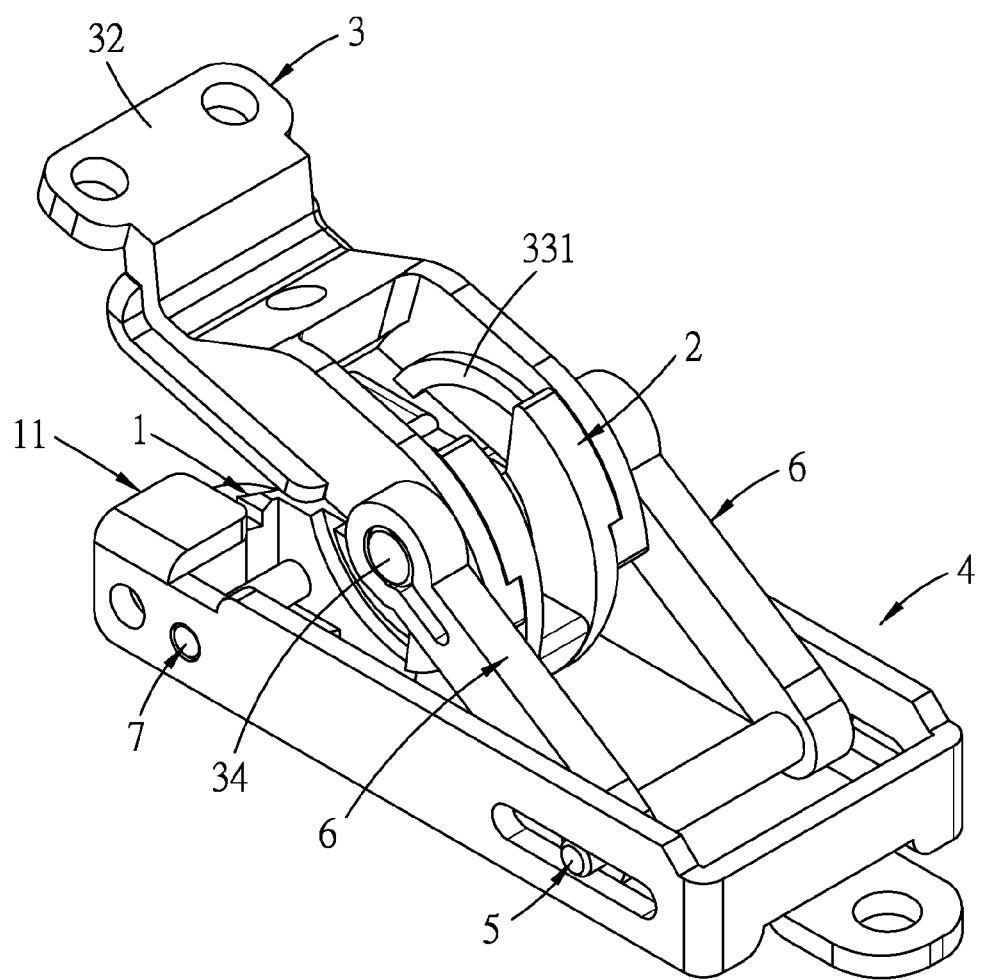
FIG. 4 is a perspective view of the embodiment in an unfolded state.

With reference to FIGS. 2 to 4, the base seat 1 includes a first object connecting section 11 which is adapted to be connected to the first object 8, and a mounting section 12 which extends from the first object connecting section 11 in a first direction (D1). The mounting section 12 has two base lateral walls 121 which are opposite to each other in a second direction (D2) that is transverse to the first direction (D1), at least one first arcuate slot 122 which is formed in one of the base lateral walls 121, and at least one first stop 123 which is disposed adjacent to the first arcuate slot 122. The first arcuate slot 122 extends along a curve of which a centre of curvature is located above a top of the base seat 1, and has an end which is adjacent to the object connecting section 11 and which has a first access port (122a) at the top of the base seat 1. In this embodiment, the mounting section 12 has two of the first arcuate slots 122 respectively formed in the base lateral walls 121, and two of the first stops 123 respectively formed on the base lateral walls 121.

The coupling member 2 is slidably connected to the mounting section 12, and has two coupling lateral walls 21 which are spaced apart from each other in the second direction (D2) to respectively have coupling inner lateral surfaces 27 that face each other and that are disposed outwardly of the base lateral walls 121, respectively, and coupling outer lateral surfaces 24 that are opposite to each other, a crosspiece portion 22 which interconnects the coupling lateral walls 21, at least one first arcuate protrusion 23 which is formed on one of the coupling inner lateral surfaces 27 and which is slidably engaged in the first arcuate slot 122, at least one second arcuate slot 25 which is formed in one of the coupling outer lateral surfaces 24, and at least one second stop 26 which is disposed adjacent to the second arcuate slot 25. The second arcuate slot 25 extends along a curve of which a centre of curvature is located above a top of the coupling member 2, and has an end which is adjacent to the first access port (122a) and which has a second access port 251 at the top of the coupling member 2. The centers of curvature of the first and second arcuate slots 122, 25 cooperatively define a rotating axis (A) that extends parallel to the top of the base seat 1 and in the second direction (D2). In this embodiment, the coupling member 2 has two of the first arcuate protrusions 23 respectively formed on the coupling inner lateral surfaces 27 and respectively engaged in the first arcuate slots 122, two of the second arcuate slots 25 respectively formed in the coupling outer lateral surfaces 24, and two of the second stops 26 respectively formed on the coupling outer lateral surfaces 24.

The sliding member 3 is slidably connected to the coupling member 2, and has two sliding lateral walls 31 which are spaced apart from each other in the second direction (D2) to respectively have sliding inner lateral surfaces 311 that face each other and that are disposed outwardly of the coupling outer lateral surfaces 24, respectively, and sliding outer lateral surfaces 312 that are opposite to each other, a second object connecting section 32 which is connected to and extends from the sliding lateral walls 31 in the first direction (D1) and which is adapted to be connected to the second object 9, and at least one second arcuate protrusion 33 which is formed on one of the sliding inner lateral surfaces 311 and which is slidably engaged in the second arcuate slot 25. In this embodiment, the sliding member 3 has two of the second arcuate protrusions 33 respectively formed on the sliding inner lateral surfaces 311 and respectively engaged in the second arcuate slots 25.

Figure 5:
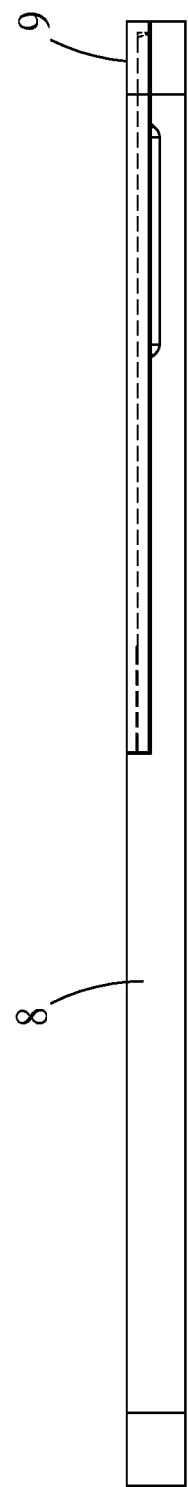
FIG. 5 is a side view illustrating the embodiment incorporated in the tablet computer and in the folded state.
Figure 6:
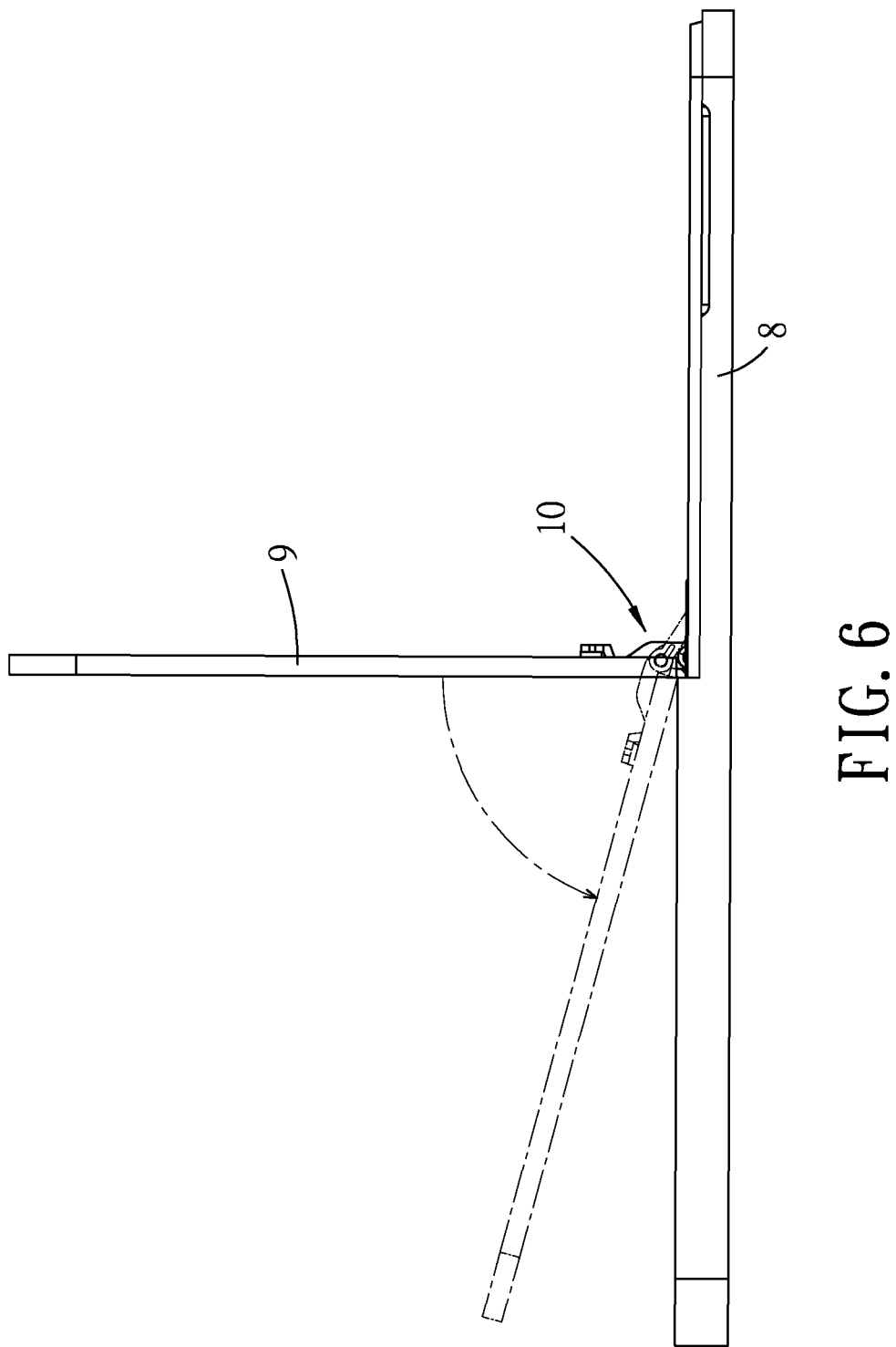
FIG. 6 is a side view similar to FIG. 5, illustrating the embodiment in a middle state between the folded state and the unfolded state.

Referring again to FIGS. 2 to 4, the hinge device 10 can be transformed between a folded state and an unfolded state. In the folded state, the first object connecting section 11 and the second object connecting section 32 are disposed at two opposite sides of the mounting section 12 in the first direction (D1) so as to allow folding of the first and second objects 8, 9 to each other (as shown in FIG. 5). The sliding member 3 is operatively turned about the rotating axis (A) relative to the base seat 1 with movement of the second arcuate protrusion 33 along the second arcuate slot 25 to bring the second arcuate protrusion 33 into abutment against the second stop 26, and to further drive turning of the coupling member 2 about the rotating axis (A) relative to the base seat 1 with movement of the first arcuate protrusion 23 along the first arcuate slot 122 until abutment of the first arcuate protrusion 23 against the first stop 123, so as to shift the hinge device from the folded state to an unfolded state, where the second object connecting section 32 is placed above the first object connecting section 11 so as to allow the second object 9 to be unfolded and inclined to the first object 8 by an angle (as indicated by dotted lines of FIG. 6 that illustrates the second object 9 is unfolded).

In the illustrated embodiment, each of the base seat 1, the coupling member 2 and the sliding member 3 is configured to have symmetric lateral structure with the first arcuate slots 122, the first arcuate protrusions 23, the second arcuate slots 25 and the second arcuate protrusions 33 being symmetrically disposed. Alternatively, each of the base seat 1, the coupling member 2 and the sliding member 3 may have asymmetric lateral structure with only one first arcuate slot 122, one first arcuate protrusion 23, one second arcuate slot 25 and one second arcuate protrusion 33. In one embodiment, the first and second arcuate slots 122, 25 may be formed at two different sides.

Figure 7:
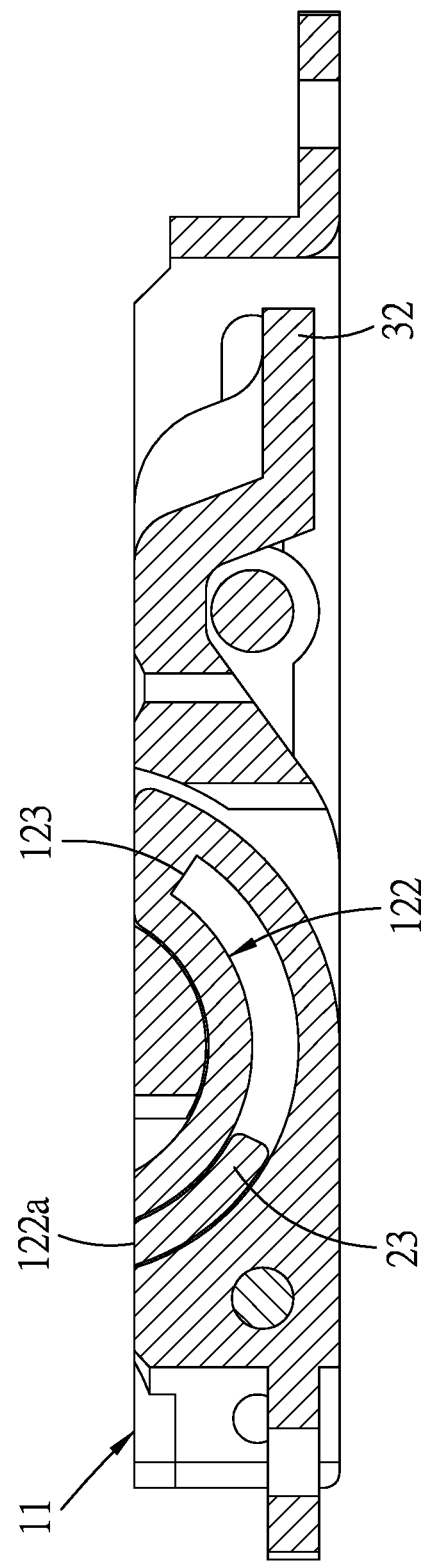
FIG. 7 is a sectional view taken along line VII-VII of FIG. 3.
Figure 8:
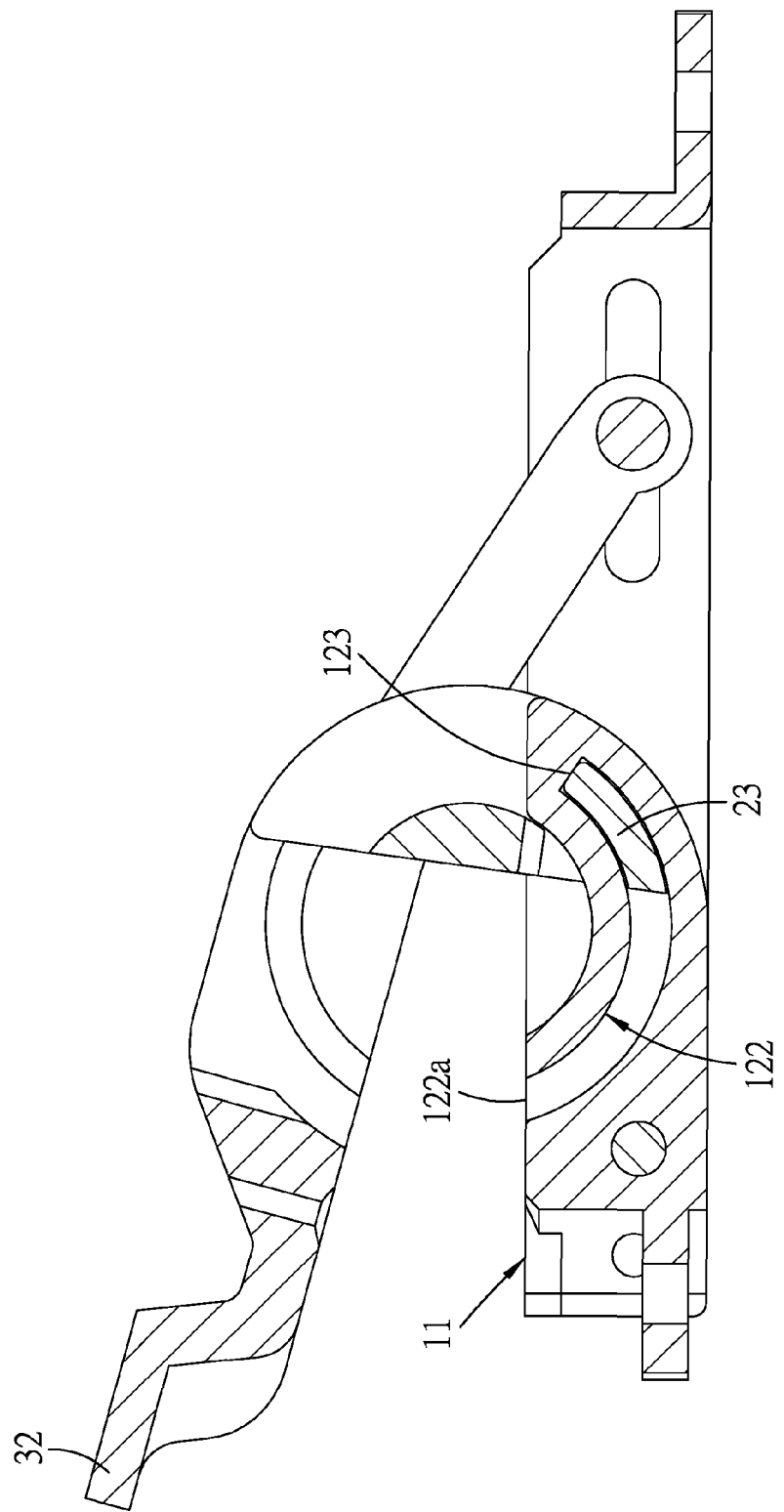
FIG. 8 is a sectional view similar to FIG. 7, but illustrating the embodiment in the unfolded state.

With reference to FIGS. 2, 7 and 8, in this embodiment, each of the first arcuate slots 122 is recessed from the respective base lateral wall 121, and has, adjacent to the top of the base seat 1, an opened end serving as the first access port (122a), and a closed end serving as the respective first stop 123. Thus, each of the first arcuate protrusions 23 is engaged in and closes the respective first access port (122a) in the folded state, and is engaged in the closed end to abut against the respective first stop 123 in the unfolded state.

Figure 9:
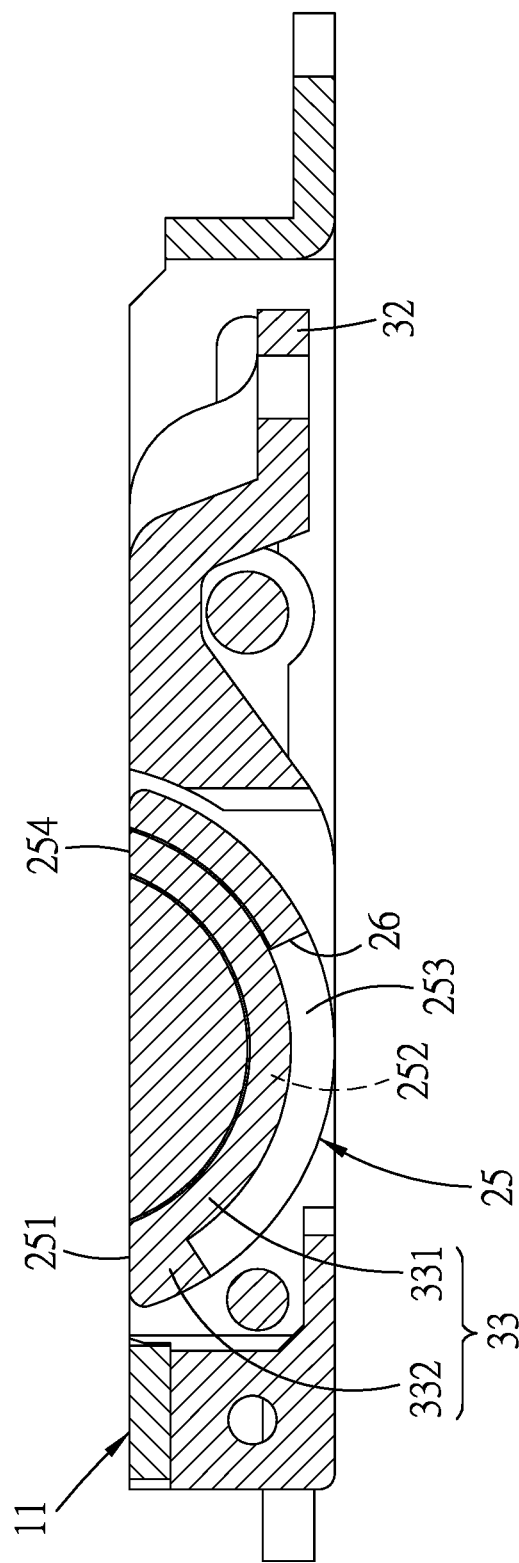
FIG. 9 is a sectional view taken along line IX-IX of FIG. 3.
Figure 10:
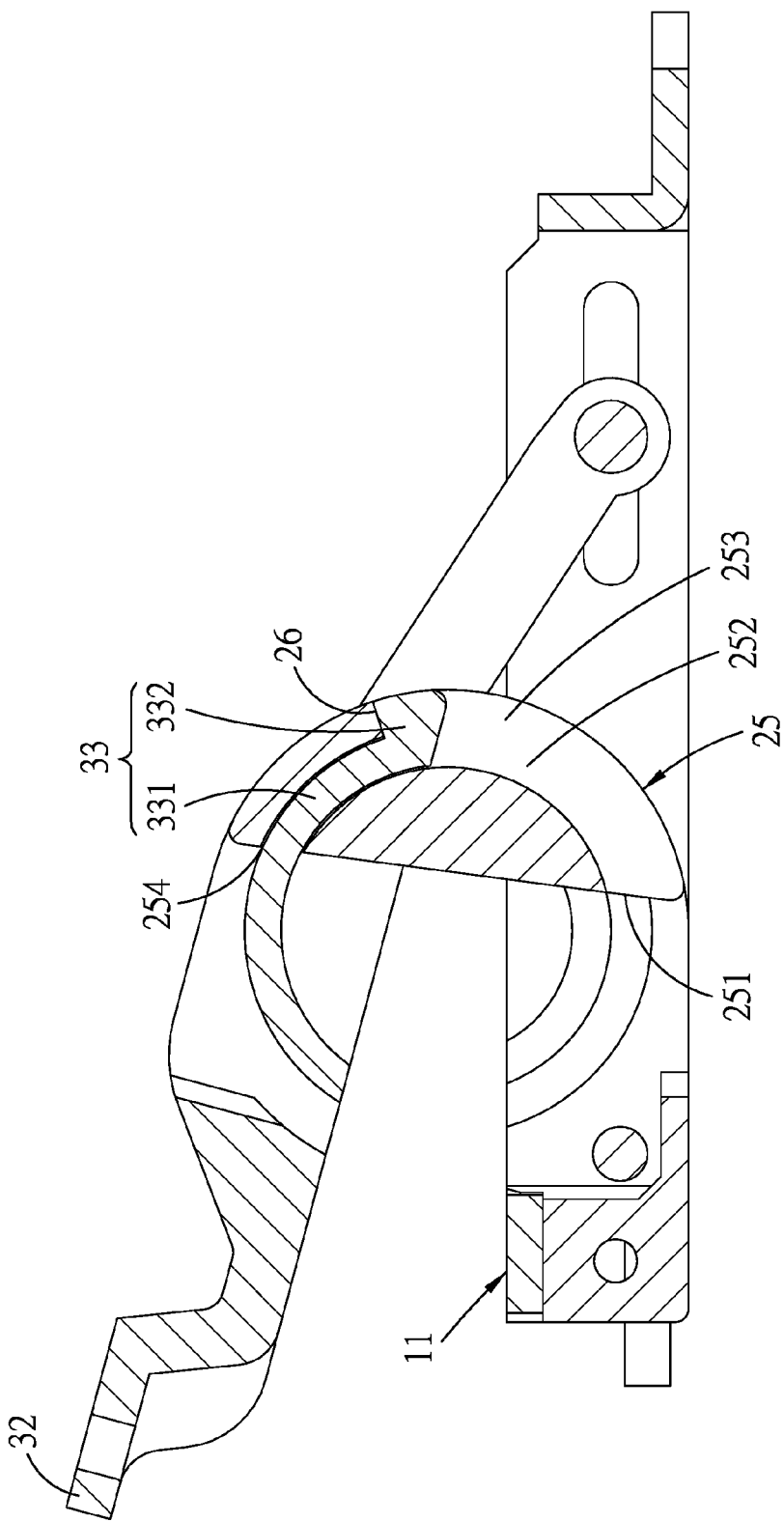
FIG. 10 is a sectional view similar to FIG. 9, but illustrating the embodiment in the unfolded state.
Figure 11:
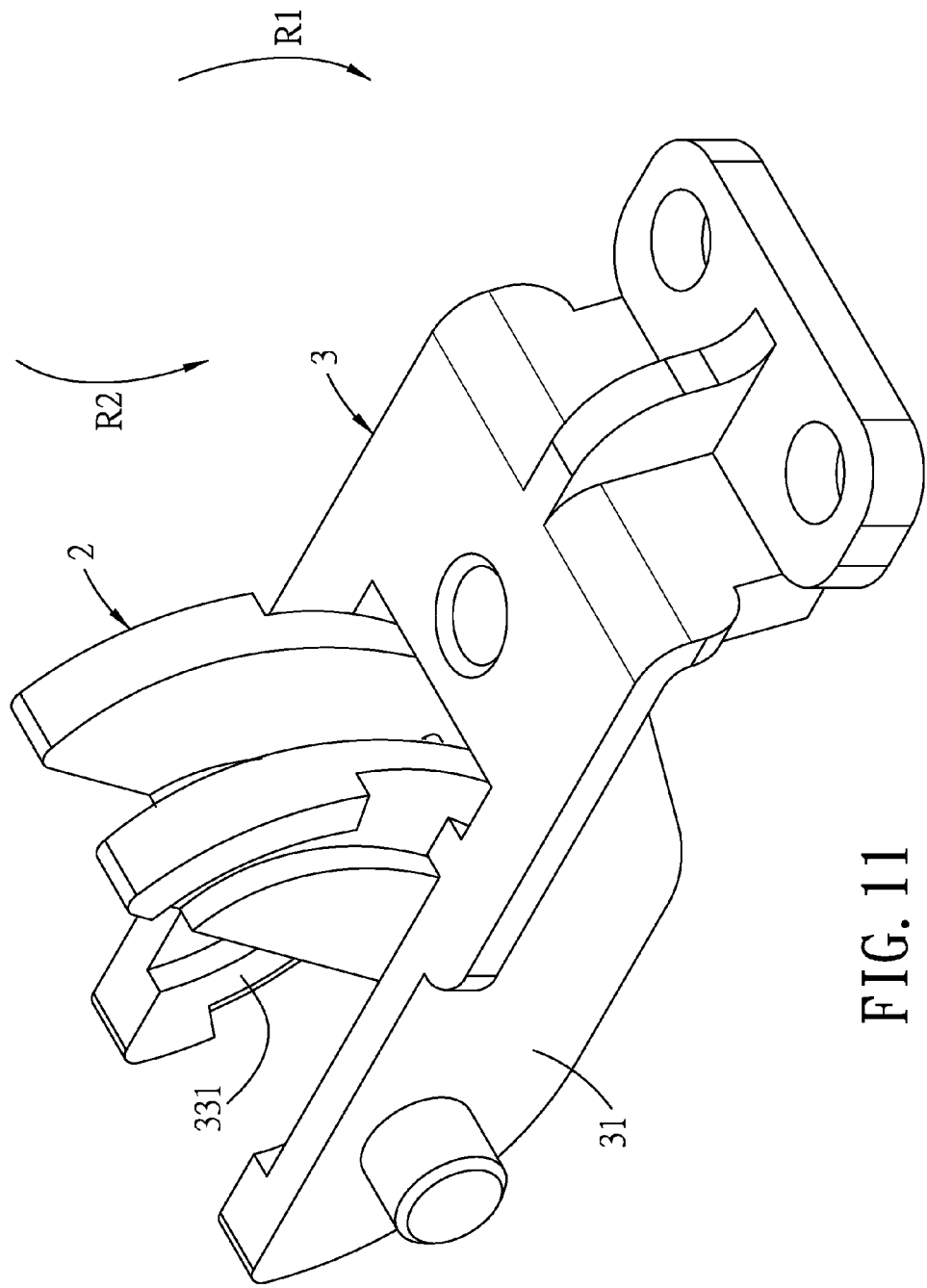
FIG. 11 to FIG. 14 are perspective views illustrating the assembly process of a base seat, a coupling member and a sliding member of the embodiment.

With reference to FIGS. 2, 9 and 10, in this embodiment, the second arcuate slot 25 has a smaller-radius slot portion 252 which is recessed from the respective coupling outer lateral surface 24 and which has two opened ends at the top of the coupling member 2 and opposite to each other in the first direction (D1), and a larger-radius slot portion 253 which surrounds the smaller-radius slot portion 252 and which has, at the top of the coupling member 2, an opened end that cooperates with one of the opened ends of the smaller-radius slot portion 252 to define the second access port 251, and a closed end that serves as the respective second stop 26. Each of the second arcuate protrusions 33 has a primary arcuate portion 331 which is configured to be engaged in the smaller-radius slot portion 252, and an abutting portion 332 which extends radially and outwardly from the primary arcuate portion 331 to be engaged in the larger-radius slot portion 253. Thus, in the folded state, as shown in FIG. 9, the primary arcuate portion 331 and the abutting portion 332 cooperatively close the second access port 251. In the unfolded state, as shown in FIG. 10, a part of the primary arcuate portion 331 projects outwardly of the respective second arcuate slot 25 from the opened end 254 of the smaller-radius slot portion 252, and the abutting portion 332 abuts against the respective second stop 26.

Figure 12:
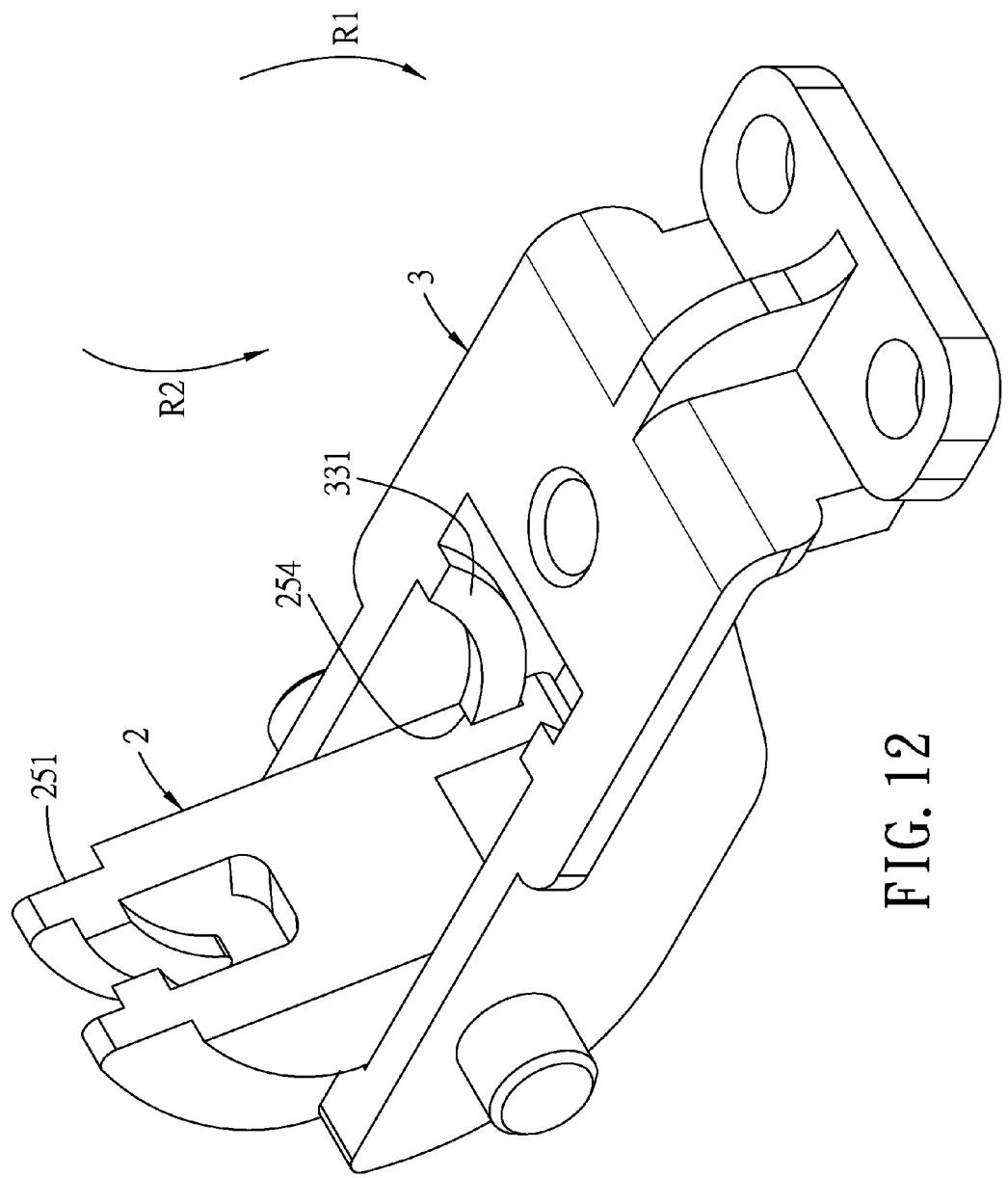
Figure 13:
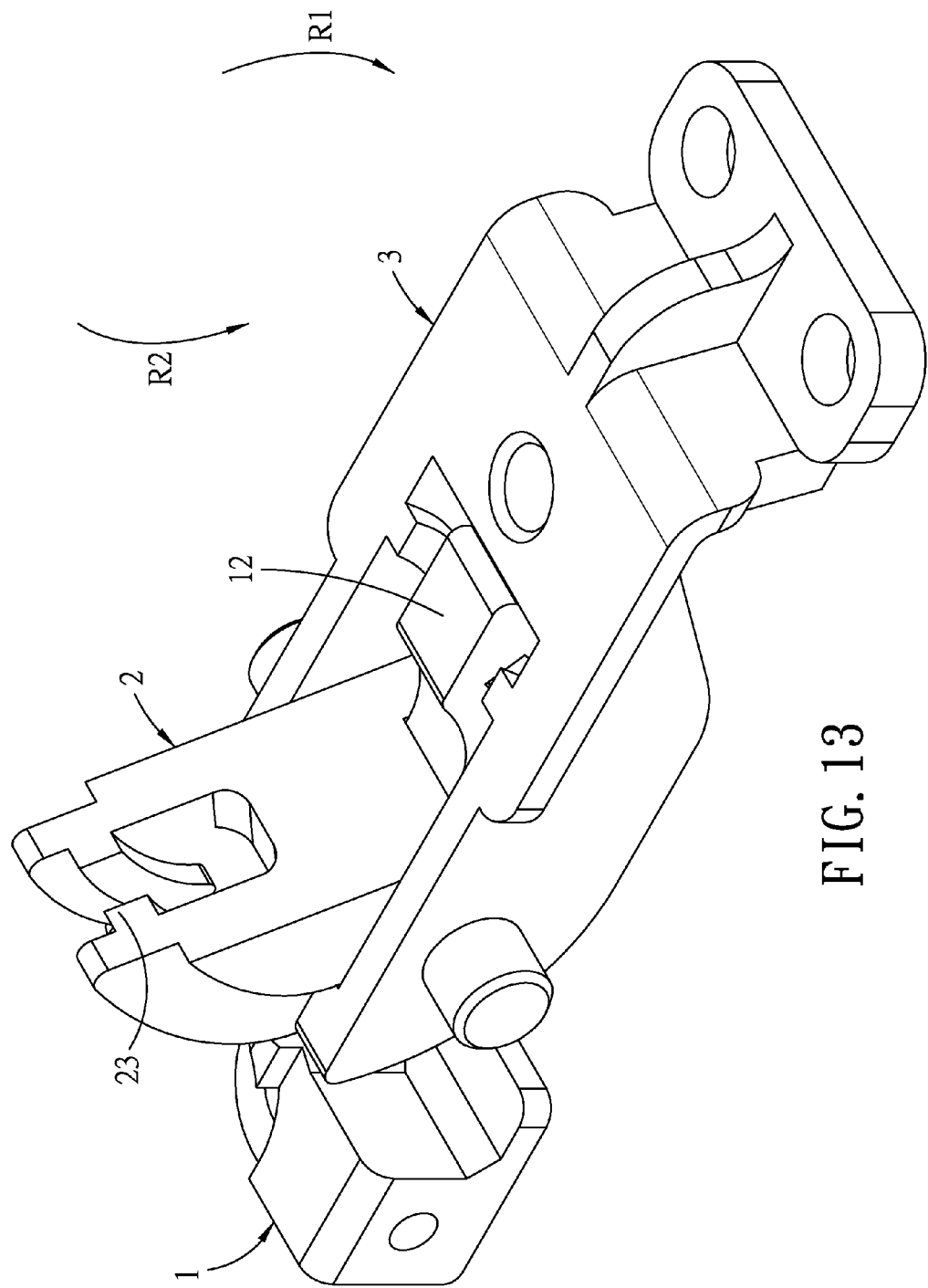
Figure 14:
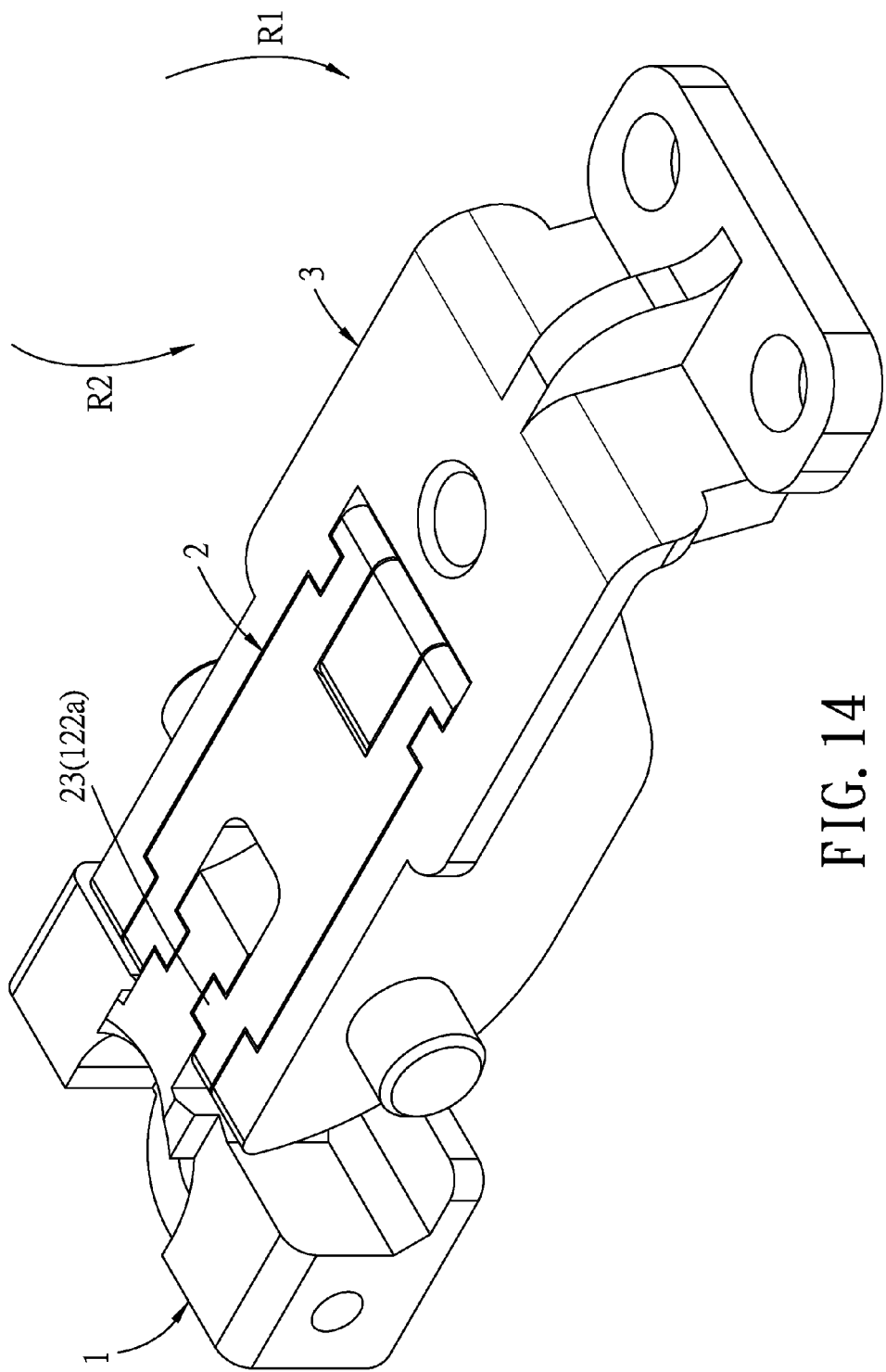

With reference to FIGS. 2, 11 to 14, in assembly, the coupling member 2 is first tilted and placed between the sliding lateral walls 31 to have each primary arcuate portion 331 slided into the respective smaller-radius slot portion 252 from the second access port 251. The coupling member 2 is then turned in a rotational direction (R1) to have part of the primary arcuate portion 331 project outwardly of the opened end 254, as shown in FIG. 12. Subsequently, referring to FIG. 13, the mounting section 12 of the base seat 1 is placed between the coupling lateral walls 21 to have each first arcuate protrusion 23 registered with the first access port (122a). Finally, referring to FIG. 14, the coupling member 2 is turned in a rotational direction (R2) to have each first arcuate protrusion 23 slided into the first arcuate slot 122. In this embodiment, since the smaller-radius slot portion 252 is in communication with both the second access port 251 at the top and the larger-radius slot portion 253 at the bottom, the primary arcuate portion 331 can be slidably engaged in the smaller-radius slot portion 252 through the second access port 251 or the larger-radius slot portion 253.

Also, in a modified embodiment, the first stop 123 may be configured not to be flush with the base lateral walls 121 but for abutment of the first arcuate protrusion 23 thereagainst. In a modified embodiment, the second stop 26 may be configured not to be flush with the coupling lateral walls 21 but for abutment of the second arcuate protrusion 33 thereagainst. Specifically, the first and second stops 123, 26 may be formed as projections disposed in the first and second arcuate slots 122, 25, respectively.

With reference to FIGS. 1 to 3, the frame member 4 has a secured end 410 which is connected with the base seat 1 adjacent to the first object connecting section 11, a frame body 41 which extends from the secured end 410 in the first direction (D1) and which has two frame walls 411 that are spaced apart from each other in the second direction (D2) to be disposed outwardly of the sliding lateral walls 31, respectively, and an object connecting end 43 which is disposed opposite to the secured end 410 in the first direction (D1) and which is adapted to be connected to the first object 8. Each of the frame walls 411 has an elongated slot 42 which is formed remote from the secured end 410 and which is elongated in the first direction (D1). The sliding member 3 has two pivot pins 34 which respectively extend from the sliding outer lateral surfaces 312 and which are respectively disposed adjacent to the abutting portions 332 of the second arcuate protrusions 33. The sliding shaft 5 extends in the second direction (D2) to have two ends that are respectively and slidably engaged in the elongated slots 42 of the frame walls 411, and a middle shaft portion that is disposed inwardly of the frame walls 411. Each of the linking arms 6 has two ends respectively journalled on the middle shaft portion of the sliding shaft 5 and the respective pivot pin 34. During turning of the sliding member 3 between the folded state and the unfolded state within a predetermined angular range, each of the linking arms 6 is in a press-fit connection with the respective pivot pin 34. The fastening shaft 7 is disposed to fasten the frame member 4 to the first object connecting section 11. Alternatively, a plurality of screw fasteners (not shown) may be fastened to the first object connecting section 11 to firmly secure the frame member 4 on the first object connecting section 11.

Figure 15:
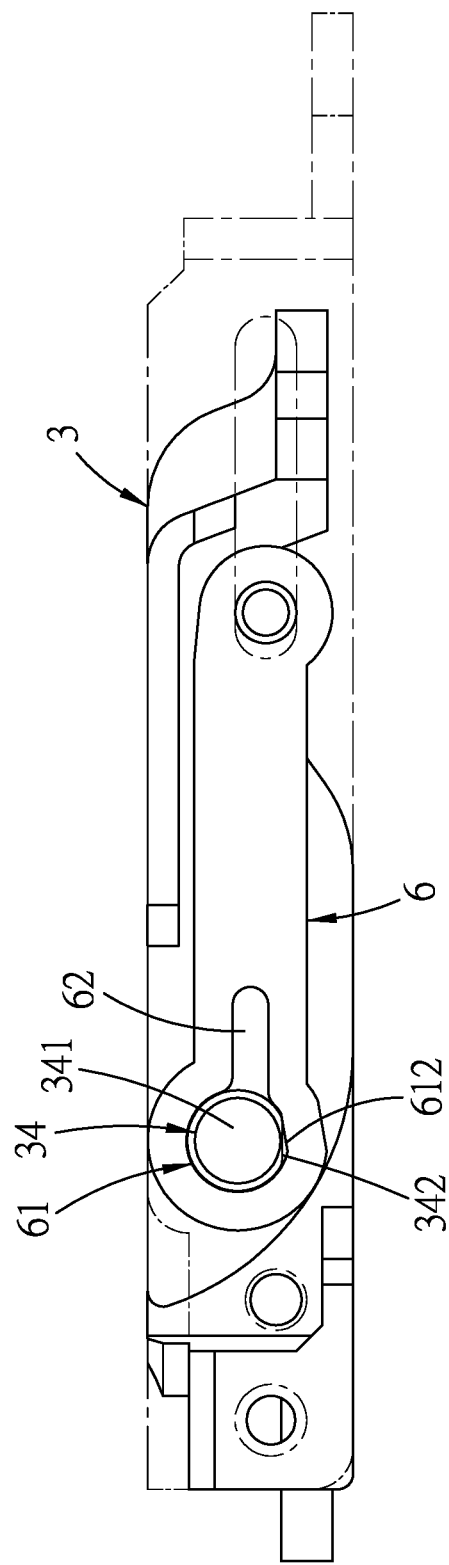
FIG. 15 is a schematic side view illustrating the embodiment in the folded state.

Specifically, with reference to FIG. 15, each of the pivot pins 34 has a cylindrical body 341 which extends in the second direction (D2), and which has a cutout portion 342 formed at a circumferential surface thereof. Each of the linking arms 6 has an inner tubular wall 61 which surrounds the circumferential surface of the cylindrical body 341 to allow rotation of the sliding member 3 relative to the linking arms 6, a friction protrusion 612 which is formed on the inner tubular wall 61, and a split 62 which extends from the inner tubular wall 61 toward the middle of the linking arm 6. As such, the sliding member 3 is turned relative to the linking arms 6 to allow engagement of the cutout portion 342 with the friction protrusion 612 when turned at an angle outside of the predetermined angular range to thereby make a loose engagement between the pivot pin 34 and the linking arm 6, and to allow frictional engagement of the cylindrical body 341 with the friction protrusion 612 when turned at an angle within the predetermined angular range to thereby make a tight engagement between the pivot pin 34 and the linking arm 6, so as to position the sliding member 3 relative to the frame member 4 by any desired angle within the predetermined angular range.

Figure 16:
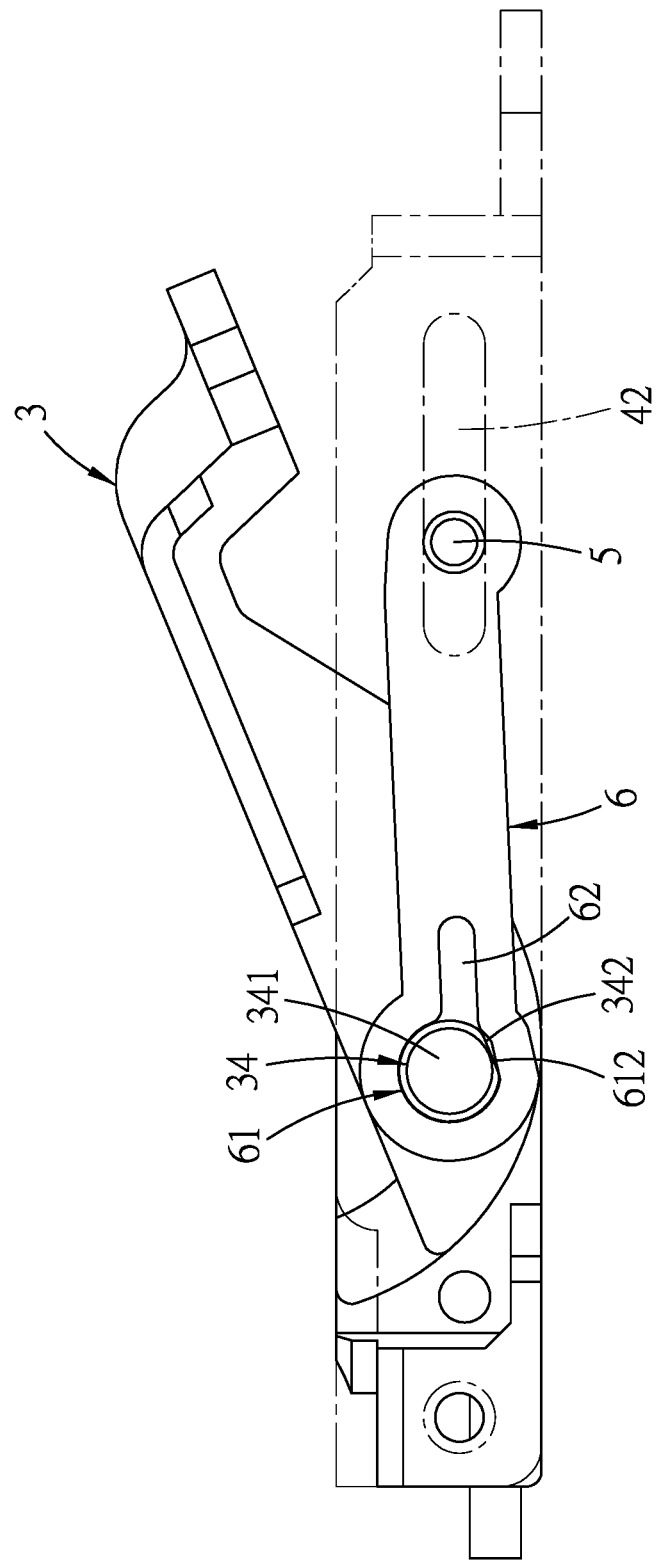
FIG. 16 is a schematic side view illustrating the embodiment in the middle state between the folded state and the unfolded state.
Figure 17:
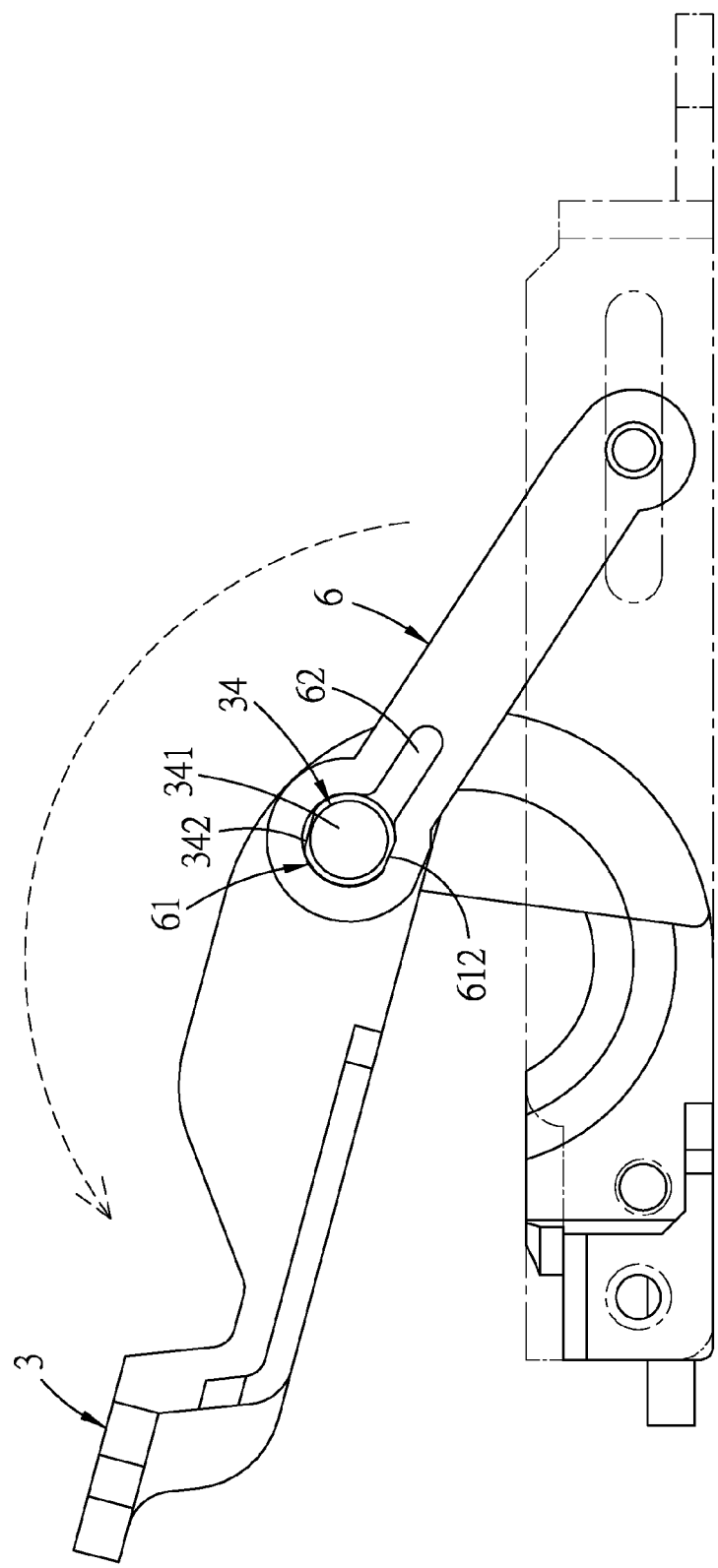
FIG. 17 is a schematic side view illustrating the embodiment in the unfolded state.
Figure 18:
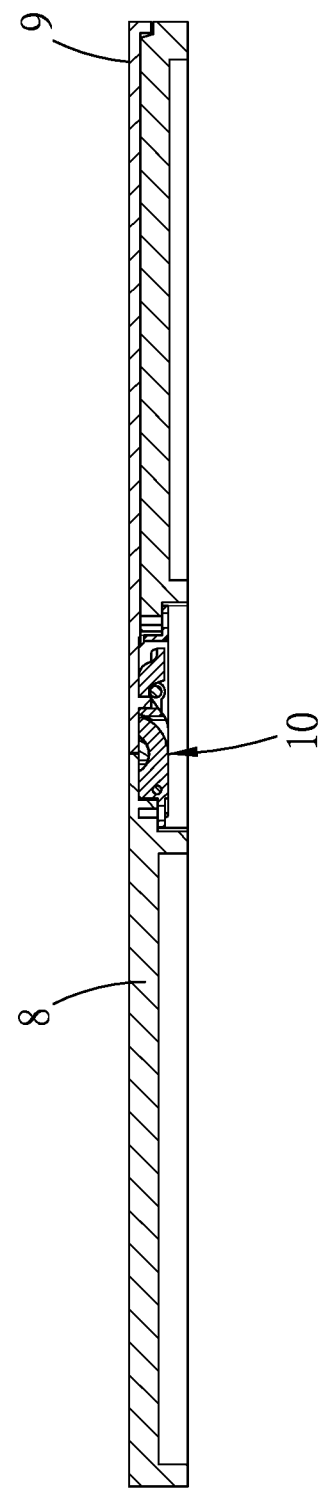
FIG. 18 is a sectional view illustrating the embodiment incorporated in the tablet computer and in the folded state.
Figure 19:
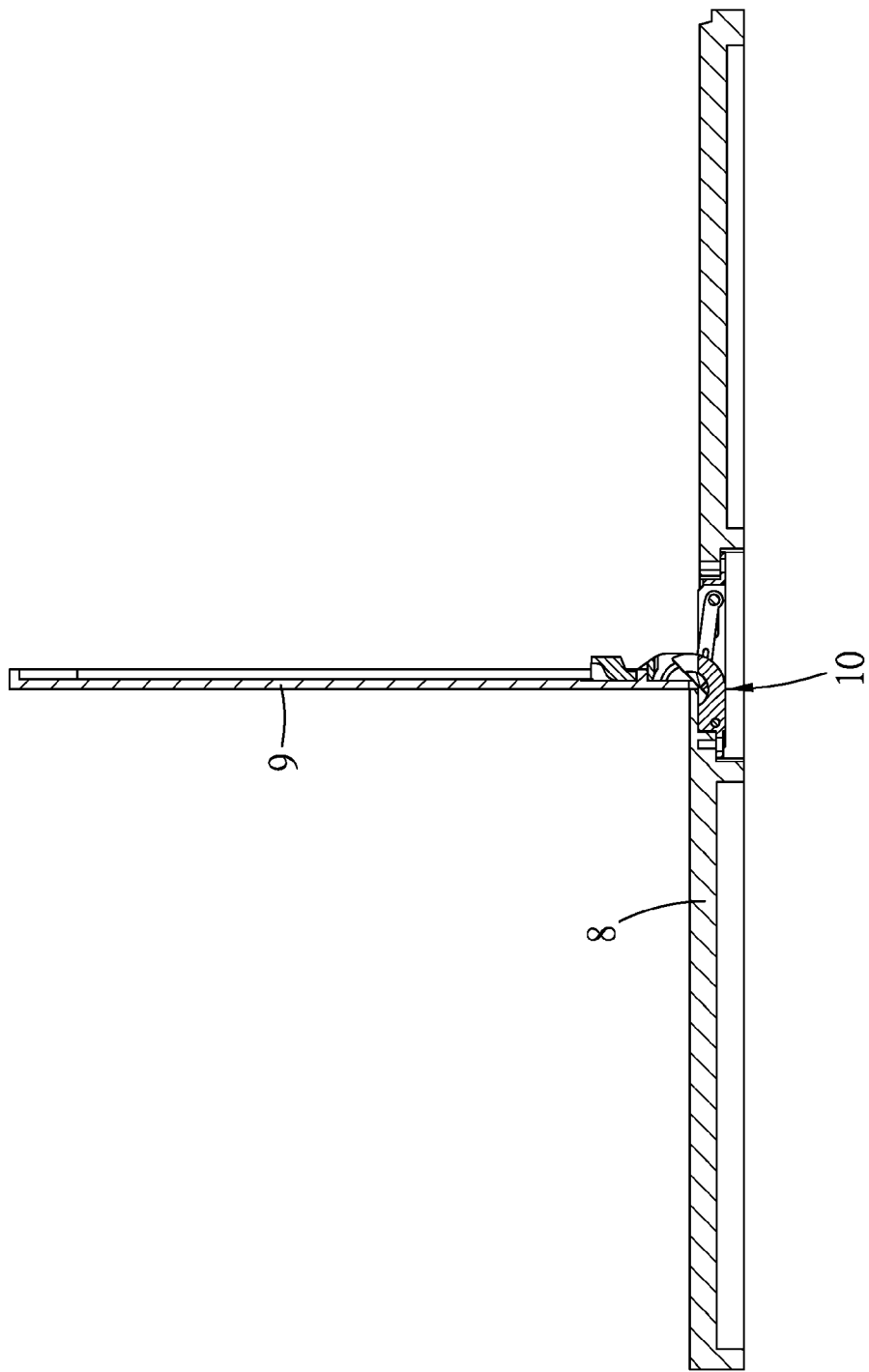
FIG. 19 is a sectional view illustrating the embodiment incorporated in the tablet computer and in the middle state between the folded and unfolded states.

Referring to FIG. 2 and FIGS. 15 to 17, in this embodiment, the largest angle within the angular range is 165 degrees (as indicated by the dotted arrow in FIG. 17). In other words, the sliding member 3 is inclined relative to the base seat 1 by 165 degrees in the unfolded state. This angle is varied as required in accordance with the configurations of the first and second arcuate slots 122, 25 and the first and second arcuate protrusions 23, 33. The angular range is determined by the configurations of the cutout portions 342 and the friction protrusions 612, and is from 22.5 degrees to 165 degrees in this embodiment. As shown in FIG. 15, when the rotational angle of the sliding member 3 is 0 (in the folded state), the friction protrusion 612 is engaged with one side of the cutout portion 342 so as to make loose engagement therebetween. As shown in FIG. 16, when the sliding member 3 is turned to 22.5 degrees with the guided movement of the sliding shaft 5 along the elongated slots 42, the pivot pin 34 is turned relative to the inner tubular wall 61 to have the friction protrusion 612 engaged with the other side of the cutout portion 342. As shown in FIG. 17, during turning of the sliding member 3 from 22.5 degrees to 165 degrees, the friction protrusion 612 is disengaged from the cutout portion 342 and in frictional engagement with the cylindrical body 341 to make a tight engagement between the pivot pins 34 and the linking arms 6.

With reference to FIGS. 2, 3 and 15, in this embodiment, the base seat 1 has a receiving concavity 13 formed in a top of the mounting section 12 between the first arcuate slots 122 and arcuated to surround the rotating axis (A). The crosspiece portion 22 of the coupling member 2 is configured to be fully received in the receiving concavity 13 in the folded state, and to be slidable relative to the receiving concavity 13 to partially project outwardly of the receiving concavity 13 in the unfolded state. Thus, in the folded state, a top of the frame member 4 is configured to be flush with the tops of the base seat 1 and the coupling member 2 and a top of the sliding member 3, and a bottom of the frame member 4 is configured to be flush with bottoms of the base seat 1, the coupling member 2 and the sliding member 3. In this embodiment, a thickness of the hinge device in an upper-and-lower direction is not more than 4 mm.

Moreover, with reference to FIGS. 2, 3, 18 and 19, in the folded state, the first object 8 is disposed to cover the mounting section 12, the coupling member 2 and a part of the sliding member 3 adjacent to the mounting section 12 and to close the first and second access ports (122*a*), 251 so as to prevent projection of the first and second arcuate protrusions 23, 33 through the first and second access ports (122*a*), 251, respectively. In a various embodiment, the first and second access ports (122*a*), 251 may be closed by other elements of the hinge device. Also, the configuration and curvature of the first arcuate slot 122 and the second arcuate slot 25 can be varied in accordance with the thickness of the first and second objects 8, 9 to have the rotational axis (A) that passes through the centers of the curvature of the first and second arcuate slots 122, 25 placed higher than tops of the first and second objects 8, 9 so as not to hinder pivoting of the first and second objects 8, 9 relative to each other.

As illustrated, with the first arcuate protrusion 23 and the second arcuate slot 25 disposed opposite to each other in the second direction (D2) to respectively engage with the first arcuate slot 122 and the second arcuate protrusion 33, the sliding member 3 is slidably connected to the base seat 1 through the coupling member 2 to be turned between the folded state and the unfolded state. The hinge device of the disclosure has a fewer number of components, which are easy to fabricate and assemble, and the assembled components have a compact structure to make the hinge device thinner.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A hinge device for connecting a first object and a second object to allow relative folding and unfolding movements with respect to each other, comprising:
   a base seat including a first object connecting section which is adapted to be connected to the first object, and a mounting section which extends from said first object connecting section in a first direction, said mounting section having two base lateral walls which are opposite to each other in a second direction that is transverse to the first direction, at least one first arcuate slot which is formed in one of said base lateral walls, and at least one first stop which is disposed adjacent to said first arcuate slot, said first arcuate slot extending along a curve of which a centre of curvature is located above a top of said base seat, and having an end which is adjacent to said object connecting section and which has a first access port at said top of said base seat;
   a coupling member slidably connected to said mounting section, and having two coupling lateral walls which are spaced apart from each other in the second direction to respectively have coupling inner lateral surfaces that face each other and that are disposed outwardly of said base lateral walls, respectively, and coupling outer lateral surfaces that are opposite to each other, a cross-piece portion which interconnects said coupling lateral walls, at least one first arcuate protrusion which is formed on one of said coupling inner lateral surfaces and which is slidably engaged in said first arcuate slot, at least one second arcuate slot which is formed in one of said coupling outer lateral surfaces, and at least one second stop which is disposed adjacent to said second arcuate slot, said second arcuate slot extending along a curve of which a centre of curvature is located above a top of said coupling member, and having an end which is adjacent to said first access port and which has a second access port at said top of said coupling member, the centers of curvature of said first and second arcuate slots cooperatively defining a rotating axis that extends parallel to said top of said base seat and in the second direction; and
   a sliding member slidably connected to said coupling member, and having two sliding lateral walls which are spaced apart from each other in the second direction to respectively have sliding inner lateral surfaces that face each other and that are disposed outwardly of said coupling outer lateral surfaces, respectively, and sliding outer lateral surfaces that are opposite to each other, a second object connecting section which is connected to and extends from said sliding lateral walls in the first direction and which is adapted to be connected to the second object, and at least one second arcuate protrusion which is formed on one of said sliding inner lateral surfaces and which is slidably engaged in said second arcuate slot,
   said sliding member being operatively turned about the rotating axis relative to said base seat with movement of said second arcuate protrusion along said second arcuate slot to bring said second arcuate protrusion into abutment against said second stop, and to further drive turning of said coupling member about the rotating axis relative to said base seat with movement of said first arcuate protrusion along said first arcuate slot until abutment of said first arcuate protrusion against said first stop, so as to shift said hinge device from a folded state, where said first object connecting section and said second object connecting section are disposed at two opposite sides of said mounting section in the first direction to allow folding of the first and second objects to each other, to an unfolded state, where said second object connecting section is placed above said first object connecting section to allow the second object to be unfolded and inclined to the first object by an angle.

2. The hinge device as claimed in claim 1, wherein said mounting section has two of said first arcuate slots respectively formed in said base lateral walls, and two of said first stops respectively formed on said base lateral walls, said coupling member having two of said first arcuate protrusions respectively formed on said coupling inner lateral surfaces and respectively engaged in said first arcuate slots, two of said second arcuate slots respectively formed in said coupling outer lateral surfaces, and two of said second stops respectively formed on said coupling outer lateral surfaces, said sliding member having two of said second arcuate protrusions respectively formed on said sliding inner lateral surfaces and respectively engaged in said second arcuate slots.

3. The hinge device as claimed in claim 2, wherein each of said first arcuate slots is recessed from a respective one of said base lateral walls, and has, adjacent to said top of said base seat, an opened end serving as said first access port, and a closed end serving as a respective one of said first stops such that, each of said first arcuate protrusions is engaged in and closes said respective first access port in the folded state, and is engaged in said closed end to abut against said respective first stop in the unfolded state.

4. The hinge device as claimed in claim 2, wherein said second arcuate slot has a smaller-radius slot portion which is recessed from a respective one of said coupling outer lateral surfaces and which has two opened ends at said top of said coupling member and opposite to each other in the first direction, and a larger-radius slot portion which surrounds said smaller-radius slot portion and which has, at said top of said coupling member, an opened end that cooperates with one of said opened ends of said smaller-radius slot portion to define said second access port, and a closed end that serves as a respective one of said second stops, each of said second arcuate protrusions having a primary arcuate portion which is configured to be engaged in said smaller-radius slot portion, and an abutting portion which extends radially and outwardly from said primary arcuate portion to be engaged in said larger-radius slot portion such that, in the folded state, said primary arcuate portion and said abutting portion cooperatively close said second access port, and such that, in the unfolded state, a part of said primary arcuate portion projects outwardly of said respective second arcuate slot from said opened end of said smaller-radius slot portion, and said abutting portion abuts against said respective second stop.

5. The hinge device as claimed in claim 2, wherein said base seat has a receiving concavity formed in said mounting section between said first arcuate slots and arcuated to surround the rotating axis, said crosspiece portion of said coupling member being configured to be fully received in said receiving concavity in the folded state, and to be slidable relative to said receiving concavity to partially project outwardly of said receiving concavity in the unfolded state.

6. The hinge device as claimed in claim 5, wherein a top of said sliding member is configured to be flush with said tops of said base seat and said coupling member in the folded state.

7. The hinge device as claimed in claim 2, further comprising a frame member having a secured end which is connected with said base seat adjacent to said first object connecting section, and a frame body which extends from said secured end in the first direction and which has two frame walls that are spaced apart from each other in the second direction to be disposed outwardly of said sliding lateral walls, respectively, each of said frame walls having an elongated slot which is formed remote from said secured end and which is elongated in the first direction, said sliding member having two pivot pins which respectively extend from said sliding outer lateral surfaces, said hinge device further comprising a sliding shaft which extends in the second direction to have two ends that are slidably engaged in said elongated slots of said frame walls, and a middle shaft portion that is disposed inwardly of said frame walls, and two linking arms, each of which has two ends journalled on said middle shaft portion and a respective one of said pivot pins such that, during turning of said sliding member between the folded state and the unfolded state within a predetermined angular range, each of said linking arms is in a press-fit connection with said respective pivot pin.

8. The hinge device as claimed in claim 7, wherein each of said pivot pins has a cylindrical body which extends in the second direction, and which has a cutout portion formed at a circumferential surface thereof, each of said linking arms having an inner tubular wall which surrounds said circumferential surface of said cylindrical body to allow rotation of said sliding member relative to said linking arms, and a friction protrusion which is formed on said inner tubular wall such that said sliding member is turned relative to said linking arms to allow engagement of said cutout portion with said friction protrusion when turned at an angle outside of the predetermined angular range to thereby make a loose engagement between said pivot pin and said linking arm, and to allow frictional engagement of said cylindrical body with said friction protrusion when turned at an angle within the predetermined angular range to thereby make a tight engagement between said pivot pin and said linking arm.

9. The hinge device as claimed in claim 8, wherein each of said linking arms has a split extending from said inner tubular wall.

10. The hinge device as claimed in claim 7, wherein said frame member has an object connecting end which is disposed opposite to said secured end in the first direction and which is adapted to be connected to the first object.

11. The hinge device as claimed in claim 10, wherein a top of said frame member is configured to be flush with said tops of said base seat and said coupling member and a top of said sliding member in the folded state, a bottom of said frame member is configured to be flush with bottoms of said base seat, said coupling member and said sliding member, and a thickness of said hinge device in an upper-and-lower direction is not more than 4 mm.

* * * * *